(12) United States Patent
Gong et al.

(10) Patent No.: US 8,931,742 B2
(45) Date of Patent: Jan. 13, 2015

(54) CABLE MANAGEMENT APPARATUS

(71) Applicant: ScienBiziP Consulting (Shen Zhen) Co., Ltd., Shenzhen (CN)

(72) Inventors: Xin-Hu Gong, Shenzhen (CN); Ju-Wen Dai, Shenzhen (CN); Wei-Fei Ding, Shenzhen (CN)

(73) Assignee: ScienBiziP Consulting (Shen zhen) Co., Ltd., Guangdong (CN)

( * ) Notice: Subject to any disclaimer, the term of this patent is extended or adjusted under 35 U.S.C. 154(b) by 90 days.

(21) Appl. No.: 13/678,865

(22) Filed: Nov. 16, 2012

(65) Prior Publication Data
US 2014/0001314 A1 Jan. 2, 2014

(30) Foreign Application Priority Data
Jun. 29, 2012 (CN) .......................... 2012 1 0221097

(51) Int. Cl.
*F16L 3/00* (2006.01)
(52) U.S. Cl.
USPC .............. 248/49; 248/68.1; 248/74.1; 248/70
(58) Field of Classification Search
CPC ......... F16L 3/015; F16L 3/01; F16M 13/022; H05K 7/1491
USPC .......................... 248/49, 68.1, 74.1, 70, 282.1
See application file for complete search history.

(56) References Cited

U.S. PATENT DOCUMENTS

| | | | |
|---|---|---|---|
| 7,026,551 B2 * | 4/2006 | Franz et al. ..................... | 174/69 |
| 7,097,047 B2 * | 8/2006 | Lee et al. ..................... | 211/26.2 |
| 7,473,846 B2 * | 1/2009 | Doerr et al. ..................... | 174/69 |
| 2011/0290955 A1 * | 12/2011 | Yu et al. .......................... | 248/70 |

* cited by examiner

*Primary Examiner* — Amy J. Sterling
(74) *Attorney, Agent, or Firm* — Novak Druce Connolly Bove + Quigg LLP

(57) ABSTRACT

A cable management apparatus includes two mounting brackets, a cable management arm connected between the two mounting brackets and slidable vertically, and two elevating mechanisms. Each of the elevating mechanisms includes opposite sides respectively rotatably connected to one of the mounting brackets and abutting a bottom of the cable management arm. When the elevating mechanisms are rotated relative to the mounting brackets, the elevating mechanisms drive the cable management arm to slide vertically. The cable management arm defines a number of positioning holes. Each of the elevating mechanisms includes a locating pin to be operable to engage in one of the corresponding positioning holes to prevent the rotation of the elevating mechanisms.

8 Claims, 6 Drawing Sheets though the mounting hole 3311 of the mounting portion 331 of the operation member 33. The first abutting portion 3313 and the second abutting portion 3314 of the mounting portion 331 respectively resist two opposite sides of each wheel 32, to prevent the wheel 32 from sliding out of the mounting portion 331. The locating pin 333 of the operation member 33 is engageable in one of the first locating holes 121 or one of the second locating holes 123 of the rear flange 12 of the cable management arm 10. The resilient member 34 is sleeved on the pole body 351 of the connecting pole 35. The pole body 351 of the connecting pole 35 extends through the resilient member 34 and the mounting hole 3311 of the operation member 33, and then is fastened in the fixing hole 213 of the fixing plate 21 of the mounting bracket 20, with opposite ends of the resilient member 34 respectively resisting the cap 352 of the connecting pole 35 and the second abutting portion 3314 of the mounting portion 331 of the operation member 33. The resilient member 34 provides elastic force to drive the locating pin 333 to extend through one of the slide slots 152 of the front flange 15 of the cable management arm 10, and then extend into one of the first locating holes 121 of the rear flange 12 of the cable management arm 10.

CABLE MANAGEMENT APPARATUS

BACKGROUND

1. Technical Field

The present disclosure relates to a cable management apparatus for electronic equipment.

2. Description of Related Art

Electronic equipment, such as a server, includes a chassis and a plurality of functional modules, such as cooling modules, storage modules, and power supply modules, mounted in the chassis. The functional modules are interconnected through cables. Therefore, a cable management apparatus is fastened to a rear end of the chassis to facilitate cable management. However, the cable management apparatus often has to be detached from the chassis through the rear end of the chassis, when a functional module is inserted into or is removed from the chassis, which is inconvenient.

BRIEF DESCRIPTION OF THE DRAWINGS

Many aspects of the present embodiments can be better understood with reference to the drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
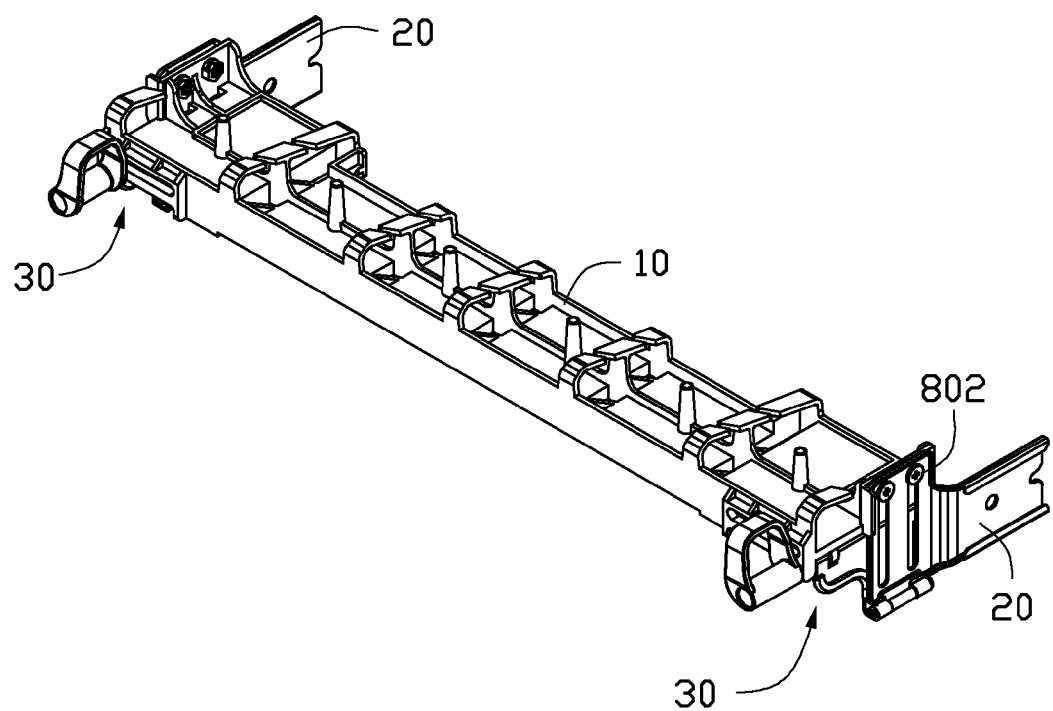
FIG. 1 is an assembled, isometric view of an embodiment of a cable management apparatus.
Figure 5:
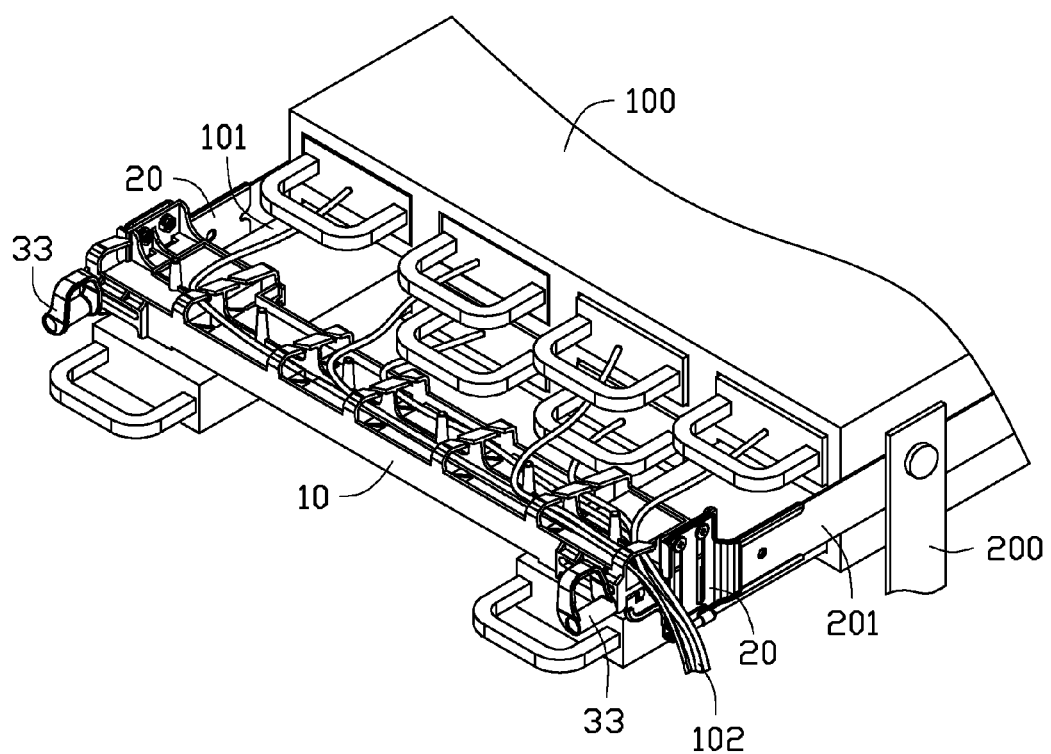
FIGS. 5 and 6 are assembled views of the cable management apparatus of FIG. 1, an electronic device, and a rack, but showing the cable management apparatus in different using statuses.
Figure 6:
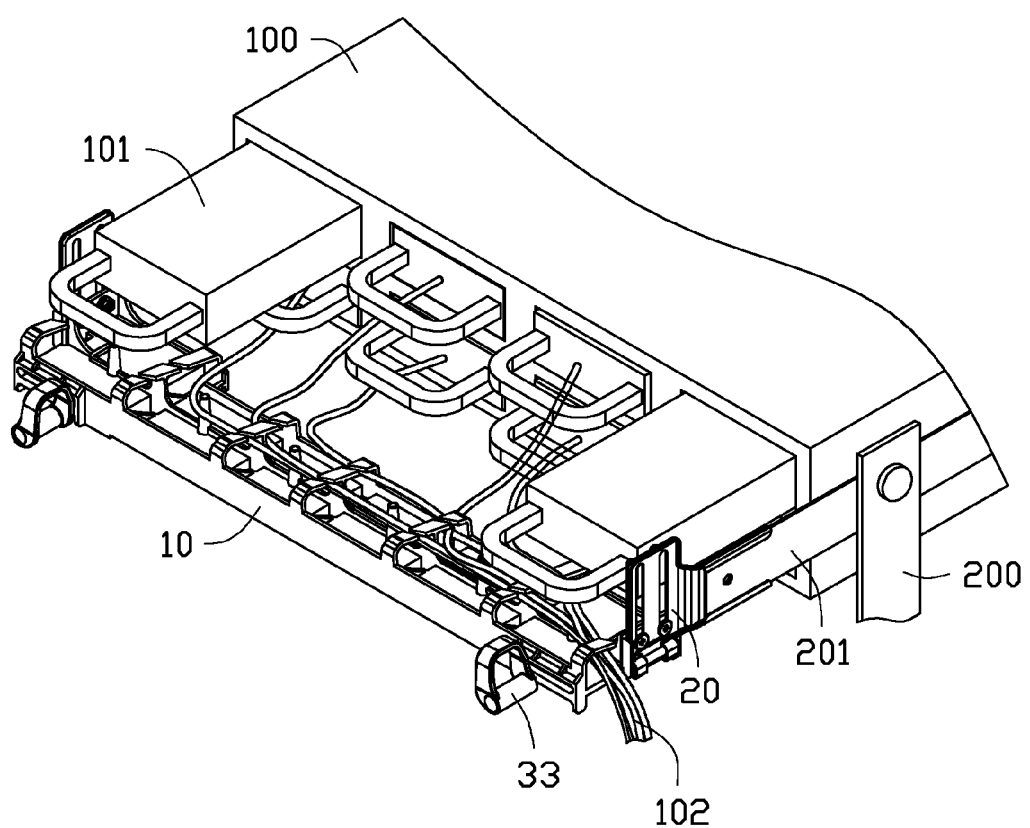

FIGS. 1, 5, and 6 illustrate an embodiment of a cable management apparatus of the present disclosure. The cable management apparatus is mounted at a back of an electronic device 100, such as a server. The server is mounted to a pair of rails 201 of a rack 200. The electronic device 100 includes a plurality of functional modules 101, such as power supplies, data storage devices, and cooling modules, which may be withdrawn from the back of the electronic device 100. Cables 102 of the functional modules 101 are supported on the cable management apparatus. The cable management apparatus includes a cable management arm 10, two mounting brackets 20, and two elevating mechanisms 30.

Figure 2:
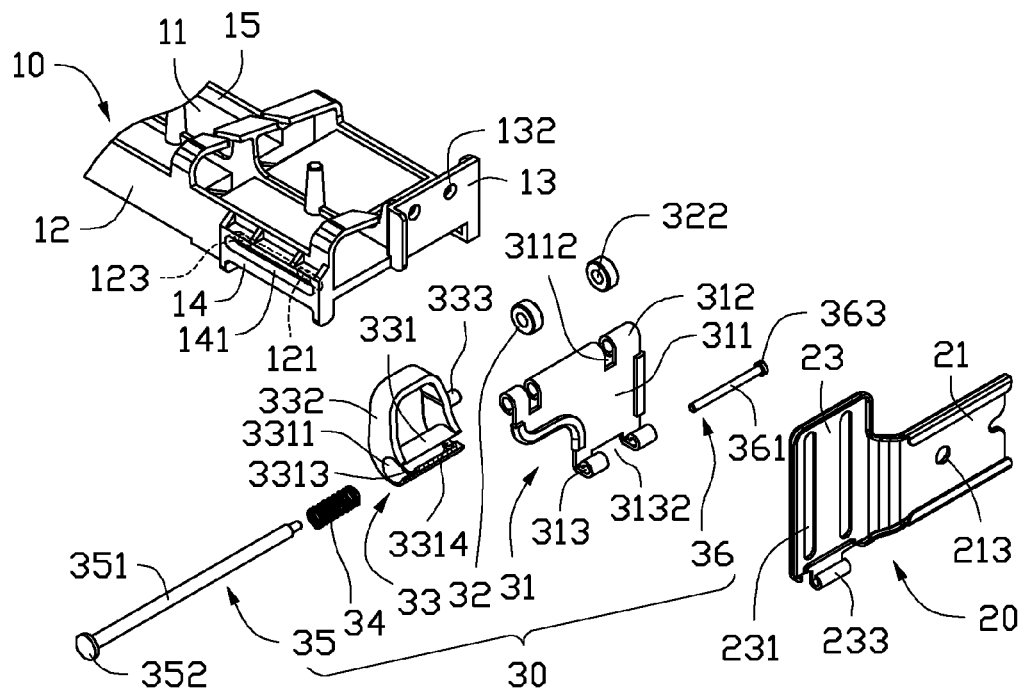
FIG. 2 is a partially exploded view of the cable management apparatus of FIG. 1.
Figure 3:
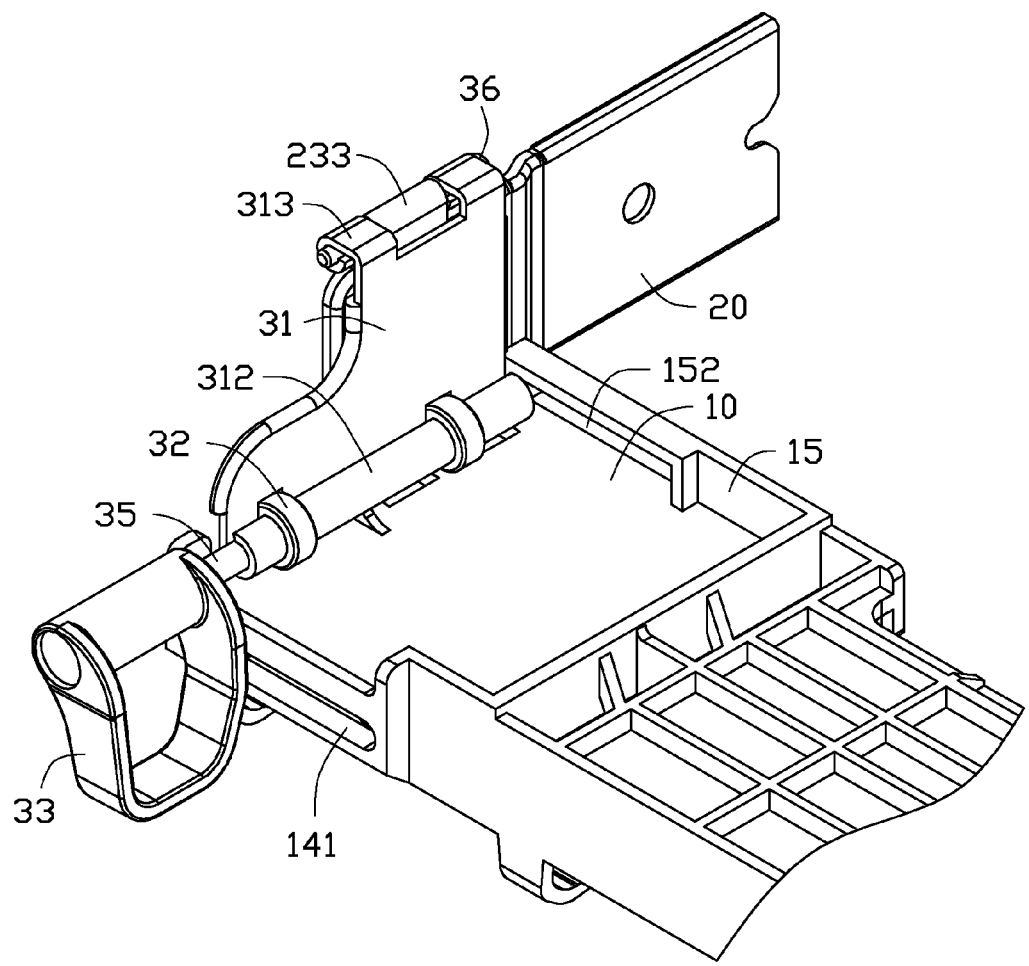
FIG. 3 is a partial, enlarged, and inverted view of FIG. 1.

FIGS. 2 and 3 shows that the cable management arm 10 includes a base plate 11 and a rear flange 12, perpendicularly connected to a rear side of the base plate 11. A front flange 15 is perpendicularly connected to a front side of the base plate 11, and two end plates 13 extending up from opposite ends of the base plate 11. Two blocks 14 protrude from the rear flange 12 and are respectively adjacent to the end plates 13. A slide slot 141 is defined in each of the blocks 14 and extends in a direction perpendicular to the end plates 13. The rear flange 12 defines two first locating holes 121, each respectively communicating with the slide slots 141 and adjacent to ends of the slide slots 141 near the corresponding end plates 13. In addition, two second locating holes 123 are respectively communicating with the slide slots 141 and are adjacent to the ends of the slide slots 141, away from the corresponding end plates 13. Each of the end plates 13 defines two fixing holes 132. The front flange 15 defines two slide slots 152 under the base plate 11, respectively adjacent to the two end plates 13. The slide slots 152 extend in parallel with the slide slots 141.

Each of the mounting brackets 20 includes a mounting plate 23 and a fixing plate 21 extending from a side of the mounting plate 23. The fixing plate 21 defines a fixing hole 213. The mounting plate 23 defines two vertical slide slots 231. A curved connection portion 233 is formed at a bottom side of the mounting plate 23.

Each of the elevating mechanisms 30 includes a supporting member 31, two wheels 32, an operation member 33, a resilient member 34, a connecting pole 35, and a pivot pole 36.

The supporting member 31 includes a planar main body 311, a curved first coupling portion 312 formed on a first side of the main body 311, and a curved second coupling portion 313 formed on a second side of the main body 311 opposite to the first coupling portion 312. The first coupling portion 312 radially defines two notches 3112. The second coupling portion 313 radially defines a notch 3132.

Each of the wheels 32 defines a pivot hole 322.

The operation member 33 includes a cylindrical mounting portion 331 axially defining a mounting hole 3311, an arc-shaped handle 332 with opposite ends respectively connected to opposite ends of the mounting portion 331, a locating pin 333 extending rearwards from an outside of the handle 332 and parallel to the mounting portion 331. An annular first abutting portion 3313 protrudes on an inner wall of the mounting portion 331, adjacent to a rear end of the mounting portion 331. An annular second abutting portion 3314 protrudes on the inner wall of the mounting portion 331, adjacent to a front end of the mounting portion 331. The second abutting portion 3314 is thicker than the first abutting portion 3313 in the radial direction of the mounting portion 331.

In one embodiment, the resilient member 34 is a coil spring.

The connecting pole 35 includes a pole body 351 and a cap 352 formed on an end of the pole body 351.

The pivot pole 36 includes a pole body 361 and a cap 363 formed on an end of the pole body 361.

In assembly, one of the mounting brackets 20 and one of the elevating mechanisms 30 are mounted to each of opposite ends of the cable management arm 10. The mounting plate 23 of the mounting bracket 20 abuts a corresponding end plate 13, with the slide slots 231 of the mounting bracket 20 respectively aligning with the fixing holes 132 of the end plate 13. Two fasteners 802 respectively extend through the slide slots 231 and are fastened in the corresponding fixing holes 132, to slidably mount the mounting bracket 20 to the cable management arm 10 along the extension direction of the slide slots 231.

The connection portion 233 of the mounting bracket 20 is engaged in the notch 3132 of the second coupling portion 313 of the supporting member 31. The pole body 361 of the pivot pole 36 rotatably extends though the second coupling portion 313 of the supporting member 31 and the connection portion 233 of the mounting bracket 20, with the cap 363 abutting a front end of the second coupling portion 313. The second coupling portion 313 is deformed to tightly hold the pivot pole 36. Therefore, the pivot pole 36 is fixed to the supporting member 31. The supporting member 31 is rotatably connected to the mounting bracket 20.

The wheels 32 of the elevating mechanism 30 are respectively engaged in the notches 3112 of the first coupling portion 312 of the supporting member 31 and axially aligned with the first coupling portion 312. The resilient member 34 is received in the mounting hole 3311 of the operation member 33. The resilient member 34 axially extends through the first abutting portion 3313 and abuts the second abutting portion 3314. The pole body 351 of the connecting pole 35 extends though the mounting hole 3311, the resilient member 34, the first coupling portion 312 of the supporting member 31, and the pivot hole 322 of the wheels 32, with the cap 352 abutting a rear end of the resilient member 34. The first coupling portion 312 is deformed to tightly hold the connecting pole 35, to fix the connecting pole 35 to the supporting member 31.

The operation member 33 is manipulated to make an end of the pole body 351 opposite to the cap 352 to be slidably engaged in a corresponding slide slot 152 of the cable management arm 10, and make the locating pin 333 to be received in a corresponding slide slot 141 of the cable management arm 10. The handle 332 abuts the rear flange 12, with the resilient member 34 compressed. The wheels 32 rotatably abut a bottom of the base plate 11 of the cable management arm 10.

FIGS. 3 and 5 show that the cable management apparatus is mounted to the rear end of the electronic device 100. Two screws are extending through the fixing holes 213 of the mounting brackets 20 and are fastened to the corresponding rails 201. The handles 332 of the operation members 33 are manipulated to make the locating pins 333 slide along the corresponding slide slots 141 of the cable management arm 10, until the locating pins 333 engage in the second locating holes 123 in response to the resilient members 34 are restored. At that time, the cable management arm 10 is arranged adjacent to a bottom of the electronic device 100.

When one of the functional modules 101 arranged at the lower portion of the electronic device 100 needs to be withdrawn, the handles 332 of the operation members 33 are pulled to disengage the locating pins 333 from the second locating holes 123. At the same time, the resilient members 34 are compressed with the second abutting portions 3314 to move towards the caps 352 of the corresponding connecting poles 35. The operation members 33 are driven away from each other to make the locating pins 333 slide along the corresponding slide slots 141 towards the corresponding first locating holes 121. At the same time, the supporting members 31 are pivoted up relative to the corresponding mounting bracket 20, with the wheels 32 rolling along the bottom of the base plate 11 of the cable management arm 10 towards the corresponding mounting bracket 20 to drive the cable management arm 10 up. When the locating pins 333 of the operation members 33 align with the corresponding first locating holes 121, the resilient members 34 are restored to drive the operation members 33 to move forwards to engage the locating pins 333 in the first locating holes 121, thereby to fix the operation member 33 and the supporting member 31. Therefore, the cable management arm 10 is fixed between the mounting bracket 20, adjacent to a top of the electronic device 100, to provide a space for withdrawing the functional module 101 arranged at the lower portion of the electronic device 100.

Figure 4:
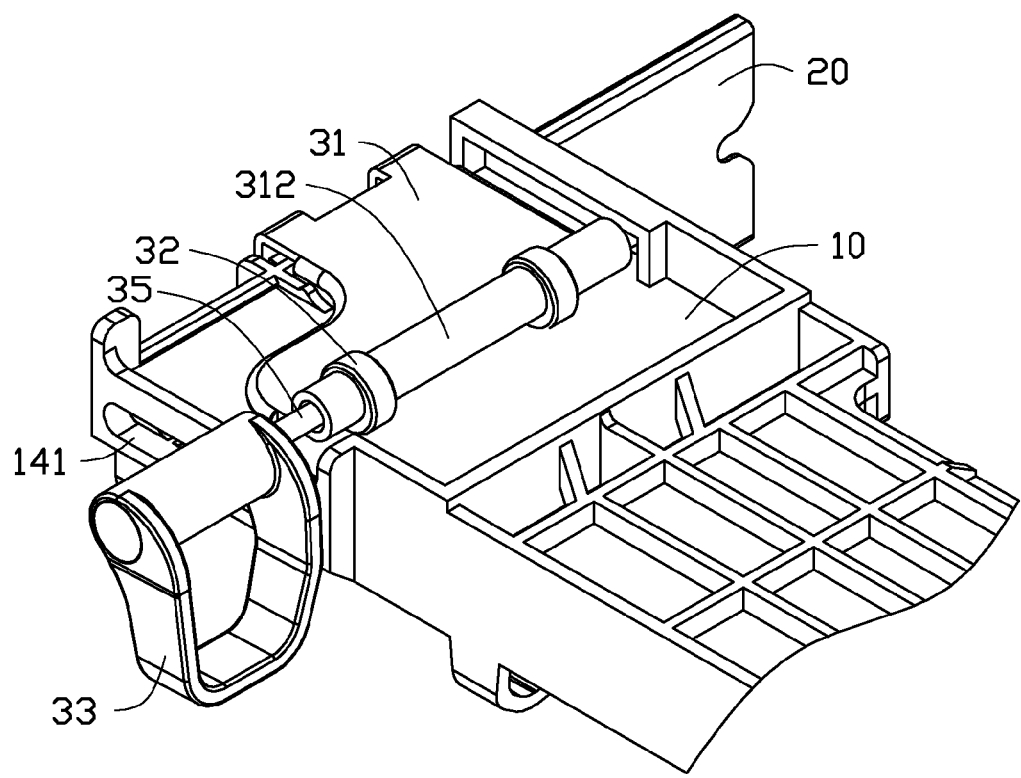
FIG. 4 shows the cable management apparatus of FIG. 3 in a different state.

FIGS. 4 and 6 show when one of the functional modules 101 arranged at the upper portion of the electronic device 100 needs to be withdrawn, the operation members 33 are pulled to disengage the locating pins 333 from the first locating holes 121 with the resilient members 34 compressed. The operation members 33 are driven towards each other with the locating pins 333 sliding towards the corresponding second locating holes 123. At the same time, the supporting members 31 are pivoted down relative to the corresponding mounting bracket 20 with the cable management arm 10 sliding down. When the locating pins 333 of the operation members 33 align with the corresponding second locating holes 123, the resilient members 34 are restored to drive the operation members 33 to move forwards to engage the locating pins 333 into the second locating holes 123, to fix the operation member 33 and the supporting member 31. Therefore, the cable management arm 10 is fixed between the mounting bracket 20 adjacent to a bottom of the electronic device 100 to provide a space for withdrawing the functional module 101 arranged at the upper portion of the electronic device 100.

It is to be understood, however, that even though numerous characteristics and advantages of the present disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A cable management apparatus for cables of an electronic device, comprising:
    two mounting brackets respectively fixed to opposite sides of the electronic device and extending out of an end of the electronic device;
    a cable management arm mounted between the two mounting brackets, and defining a plurality of locating holes; and
    two elevating mechanisms, each comprising a supporting member comprising a first coupling portion and a second coupling portion located on opposite ends of the cable management arm, two wheels connected to the second coupling portion and rotatably abutting the bottom of the cable management arm, the first coupling portion pivotably connected to a bottom side of one of the two mounting brackets; and each of the two elevating mechanisms further comprising a locating pin to engage in one of the corresponding locating holes to prevent the corresponding elevating mechanism from moving relative to the corresponding mounting bracket and the cable management arm.

2. The cable management apparatus of claim 1, wherein each of the elevating mechanisms further comprises an operation member connected to the second coupling portion; wherein the first coupling portion is pivotably connected to a bottom side of one of the two mounting brackets, and the locating pin of the elevating mechanism extends from the operation member and is slidably connected to the cable management arm.

3. The cable management apparatus of claim 2, wherein each of the first coupling portions of is curved, and the first coupling portion defines two notches, the two wheels are engaged in the two notches of the first coupling portion, and each of the elevating mechanisms further comprises a connecting pole extending through the first coupling portion of the supporting member and the two wheels of the corresponding elevating mechanism.

4. The cable management apparatus of claim 3, wherein the cable management arm comprises a base plate and a rear flange perpendicularly connected to a rear side of the base plate, two blocks protrude from the rear flange and are respectively adjacent to the two mounting brackets, a slide slot is defined in each of the blocks for slidably receiving one of the locating pin of the corresponding elevating mechanism, the plurality of locating holes comprises two first locating holes respectively communicating with the slide slot of two blocks and adjacent to ends of the corresponding slide slots near the corresponding mounting brackets, and two second locating holes respectively communicating with the slide slots and adjacent to ends of the slide slots far away from the corresponding end plates, the cable management arm is positioned at an upper position in response to the locating pin of the operation member of each of the elevating mechanisms engaging in the corresponding first locating hole, and the cable management arm is positioned at a lower position in response to the locating pin of the operation member of each of the elevating mechanisms engaging in the corresponding second locating hole.

5. The cable management apparatus of claim 4, wherein each of the elevating mechanisms further comprises a resilient member connected between the connecting pole and the operation member, and the locating pin of the operation member engages in the corresponding first or second locating hole in response to the resilient member is restored.

6. The cable management apparatus of claim 5, wherein the operation member of each of the elevating mechanisms defines a mounting hole with an axis of the mounting hole being substantially perpendicular to the rear flange of the cable management arm, an annular abutting portion protrudes on an inner wall of the mounting hole adjacent to the cable management arm, each of the connecting poles comprises a cap at an end of the connecting pole away from the cable management arm, each of the resilient members is a coil spring placed around a corresponding connecting pole and received in the mounting hole of a corresponding operation member, opposite ends of the resilient member respectively abut the cap of the connecting pole and the annular abutting portion of the operation member.

7. The cable management apparatus of claim 2, wherein each of the second coupling portions is curved and defines a notch; and a cylindrical connection portion is located at the bottom side of each of the mounting brackets, engaged in the notch of the second coupling portion of one of the supporting members, and is coaxial with the second coupling portion for a pivot pole extending through the second coupling portion and the cylindrical connection portion.

8. The cable management apparatus of claim 1, wherein each of the mounting brackets defines a vertical slide slot, a fixing hole is defined in each of opposite ends of the cable management arm and aligns with the vertical slide slot of a corresponding mounting bracket, and two fasteners extend through the vertical slide slots of the mounting brackets and are fastened in the corresponding fixing holes of the cable management arm.

\* \* \* \* \*